United States Patent [19]
Cho

[11] Patent Number: 6,137,715
[45] Date of Patent: Oct. 24, 2000

[54] STATIC RANDOM ACCESS MEMORY WITH REWRITING CIRCUIT

[75] Inventor: Yong Chul Cho, Ichon-shi, Rep. of Korea

[73] Assignee: Hyundai Electronics Industries Co., Ltd., Ichon-shi, Rep. of Korea

[21] Appl. No.: 09/328,439

[22] Filed: Jun. 9, 1999

[30] Foreign Application Priority Data

Jun. 30, 1998 [KR] Rep. of Korea ..................... 98-25297

[51] Int. Cl.⁷ ................................. G11C 11/00
[52] U.S. Cl. ......................... 365/156; 365/154; 365/190
[58] Field of Search .................................. 365/154, 156, 365/190

[56] References Cited

U.S. PATENT DOCUMENTS

| | | |
|---|---|---|
| 4,608,666 | 8/1986 | Uchida . |
| 4,811,303 | 3/1989 | Hirai . |
| 4,866,674 | 9/1989 | Tran . |
| 4,953,127 | 8/1990 | Nagahashi et al. . |
| 5,422,856 | 6/1995 | Sasaki et al. . |
| 5,724,292 | 3/1998 | Wada ................................. 365/154 X |
| 5,793,696 | 8/1998 | Tanaka et al. . |
| 5,808,956 | 9/1998 | Maruyama . |

*Primary Examiner*—Huan Hoang
*Attorney, Agent, or Firm*—Jacobson, Price, Holman & Stern, PLLC

[57] ABSTRACT

A static random access memory for improving the cell stability during read/write operation is provided. The SRAM comprises: a bit line and an inverted bit line; a memory cell coupled between the bit line and the inverted bit line for storing data; and a re-writing circuit coupled between the bit line and the inverted bit line for re-writing the data stored in the memory cell to the memory cell, in response to, at least, one read/write control signal for controlling read/write operation of the memory cell. The SRAM of this invention can be stably operated under low power voltage and/or at low temperature.

7 Claims, 5 Drawing Sheets

STATIC RANDOM ACCESS MEMORY WITH REWRITING CIRCUIT

BACKGROUND OF THE INVENTION

The present invention relates to a semiconductor memory device, and more particularly to a static random access memory (briefly called as SRAM) device, in which the stability of the cell can be improved during read/write operation.

Recently, the integrity of the semiconductor memory device has been tremendously increased. The semiconductor memory device can be roughly divided into two types: one is read/write memory and the other is read only memory. As the read/write memory, there are in turn two types: dynamic random access memory (DRAM) and static random access memory (SRAM). DRAM typically includes a number of unit memory cells which are composed of one transistor and one capacitor. Thus, DRAM is preponderant over any other memory device in integration.

However, since DRAM requires large power consumption, SRAM is more preferable in the field where high speed operation and low power consumption are requested.

As well known, since the unit cell of SRAM is generally composed of 6 transistors or composed of 4 transistors and 2 resistors, which constitutes a latch, SRAM is considerably excellent semiconductor memory device in reduction of power consumption.

However, there is a problem in that, when SRAM is driven into low power voltage and/or at low temperature, the cell stability of SRAM is considerably reduced so that the reliability of data is in turn lowered. Specially, this problem is more serious in case that SRAM is used in portable electronic device powered by low voltage.

SUMMARY OF THE INVENTION

The present invention is devised for solving the above problems. The object of the present invention is to provide a semiconductor memory device, the cell stability of which is high even when it is operated in low power voltage and/or at low temperature.

The other object of the present invention is to provide a static random access memory device having a plurality of sub-blocks, in which the voltage level of cell node can be prevented from being undesirably varied during read/write operation.

In accordance with one aspect of the present invention in order to the above objects, there is provided a semiconductor memory device comprising: a bit line and an inverted bit line; a memory cell coupled between the bit line and the inverted bit line for storing data; and a re-writing circuit coupled between the bit line and the inverted bit line for re-writing the data stored in the memory cell to the memory cell.

In one preferred embodiment, the device is a static random access memory device. The re-writing circuit may comprises: a first MOS transistor, the source-drain path of which is coupled between the bit line and a ground and the gate of which is coupled to the inverted bit line; and a second MOS transistor, the source-drain path of which is coupled between the inverted bit line and the ground and the gate of which is coupled to the bit line. Also, the device can be provided with a low power voltage equal to or below 2.0 volts.

According to another aspect of this invention, there is provided a semiconductor memory device comprising: a bit line and an inverted bit line; a memory cell coupled between the bit line and the inverted bit line for storing data; and a re-writing circuit coupled between the bit line and the inverted bit line for re-writing the data stored in the memory cell to the memory cell, in response to, at least, one read/write control signal for controlling read/write operation of the memory cell. In a specific embodiment, the re-writing circuit comprises: a first MOS transistor, the source-drain path of which is coupled between the bit line and a ground and the gate of which is coupled to the inverted bit line; a second MOS transistor, the source-drain path of which is coupled between the inverted bit line and the ground and the gate of which is coupled to the bit line; and a control transistor, the source-drain path of which is coupled between the sources of the first and the second MOS transistors and a ground, and the gate of which is coupled to the read/write control signal. The control transistor is gated in response to corresponding column decoding signal.

In another preferred embodiment, the re-writing circuit comprises: a first MOS transistor, the source-drain path of which is coupled between the bit line and a ground and the gate of which is coupled to the inverted bit line; a second MOS transistor, the source-drain path of which is coupled between the inverted bit line and the ground and the gate of which is coupled to the bit line; and a first and a second control transistors, the source-drain paths of which are coupled in series between the sources of the first and the second MOS transistors and a ground, and the gates of which are coupled to corresponding read/write control signals, respectively, wherein the first control transistor is gated in response to corresponding column decoding signal, and the second control transistor is gated in response to the combination of a chip select signal and a block select signal. Also, the re-writing circuit further comprises: an inverter for inverting the block select signal; a NOR gate for receiving the output of the inverter and the chip select signal so as to produce its output to the gate of the second control transistor.

According to still another aspect of the present invention, there is provided a semiconductor memory device comprising: a bit line and an inverted bit line; a memory cell coupled between the bit line and the inverted line for storing data; a word line for accessing the memory cell; an equalizing unit for precharging and equalizing the bit line and the inverted bit line; and a re-writing circuit coupled between the bit line and the inverted bit line for performing re-writing the data of the memory cell included in selected block but related to unselected column.

In a preferred embodiment of the present invention, the re-writing circuit comprises: a pair of re-writing transistors each of which has drain and gate cross-coupled between the bit line and the inverted bit line, for pulling down the one having relative low voltage level between the bit line and the inverted bit line; a first control transistor for controlling the activation of the re-writing transistors in response to a column decoding signal; and a second control transistor for controlling such that the re-writing circuit is activated when the column of the memory cell is not selected, in response to a chip select signal and a block select signal.

BRIEF DESCRIPTION OF THE DRAWINGS

For more complete understanding of the present invention and the advantage thereof, reference is now made to the following description taken in conjunction with the accompanying drawings in which.

DETAILED DESCRIPTION OF THE PRESENT INVENTION

Prior to the explanation of the semiconductor memory device in accordance with the present invention, a general static random access memory device used by this applicant will be explained for illustrating the problem to be solved by the present invention, with reference to FIG. 1, so as to help the deep understanding of the present invention.

Figure 1:
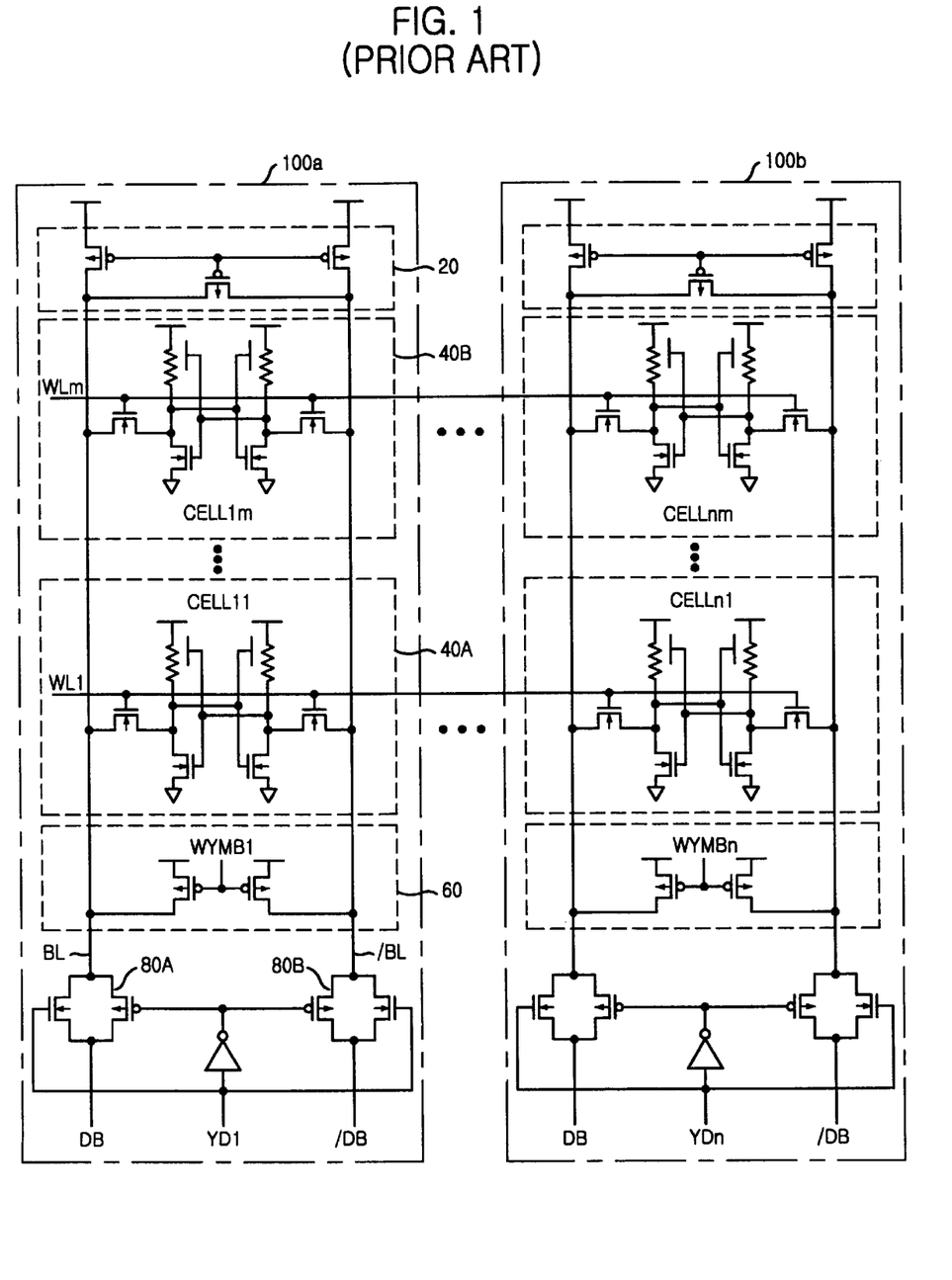
FIG. 1 is a circuit diagram for illustrating the memory cell configuration and the read/write scheme of a general semiconductor memory device.

FIG. 1 is a circuit diagram of SRAM used by this applicant, which illustrates the memory cell and read/write scheme related to the column of SRAM. Referring to FIG. 1, there are shown a plurality of columns(100A, ..., 100B), each of which comprises a bit line BL and an inverted bit line /BL, a plurality of memory cells 40A, ..., and 40B, each of which is coupled between the bit line BL and the inverted bit line /BL, an equalizer 20 which precharges and equalizes the bit line BL and the inverted bit line /BL, a pull-up unit 60 for supplying current to the bit line BL and the inverted bit line /BL during read operation or precharging, and column gate elements 80A and 80B. The column gate element 80A is coupled between the bit line BL and a data line DB, while the column gate element 80B is coupled between the inverted bit line /BL and an inverted data line /DB, so as to electrically couple them in response to corresponding column decoding signal YD1 to YDn.

In this configuration, the memory cell can be selectively accessed by corresponding word line activation so that data can be read from or written to the memory cell through corresponding bit line and inverted bit line, by means of charge sharing. The data of the bit line BL and the inverted bit line /BL can be transferred to/from the data line DB and the inverted data line by column gate elements 80A and 80B, respectively.

However, such configured SRAM has a problem in that the cell data is weaken under low power voltage (e.g. equal to or below 2.0 Volts) operation, or under low temperature (e.g. equal to or below −40° C.) operation. Especially, this problem is prevalent in such a SRAM that the unit cell includes TFTs (thin film transistor) as load elements.

Generally, semiconductor memory device composed of large number of unit memory cells can be generally divided into a plurality of sub-blocks and each of the word lines included in the semiconductor memory device may be split into a plurality of parts for reducing the load thereof. For example, one word line in one block can be shared by 64 unit memory cells. That is, if one word line is selected, the access transistors of 64 unit memory cells are simultaneously turned on. In another example, one word line in one block can be shared by 128 unit memory cells. In this case, if the semiconductor memory device is, for example, a so-called *8 product (which means it reads and writes data by 8 at one time), data cannot be read from or written from the other 120 unit memory cells rather than the selected 8 unit memory cells among 128 unit memory cells related to the same word line. In other words, 8 column decoding signals among 128 column decoding signal YD1 to YDn (in this example, n is 128) are active while the other 120 column decoding signals remain non-active.

However, in the unselected 120 unit memory cells, the read cycle operations except the column gating are performed, as in the selected 8 unit memory cells. In more detail, in the unselected unit memory cells, since the bit line BL and the inverted bit line /BL are precharged to the power voltage Vcc, the voltage level of the cell nodes CN1 and CN2 are floated so that the cell stability may be weaken, thereby causing to fail in read/write operation. In addition, this phenomenon becomes prevalent in low power voltage operation or at low temperature operation.

Hereinafter, for explaining in detail in such a manner that the present invention may easily be carried out by a person having ordinary skill in the art to which the present invention, the preferred embodiments of the present invention will be described with reference to the accompanying drawings.

Figure 3:
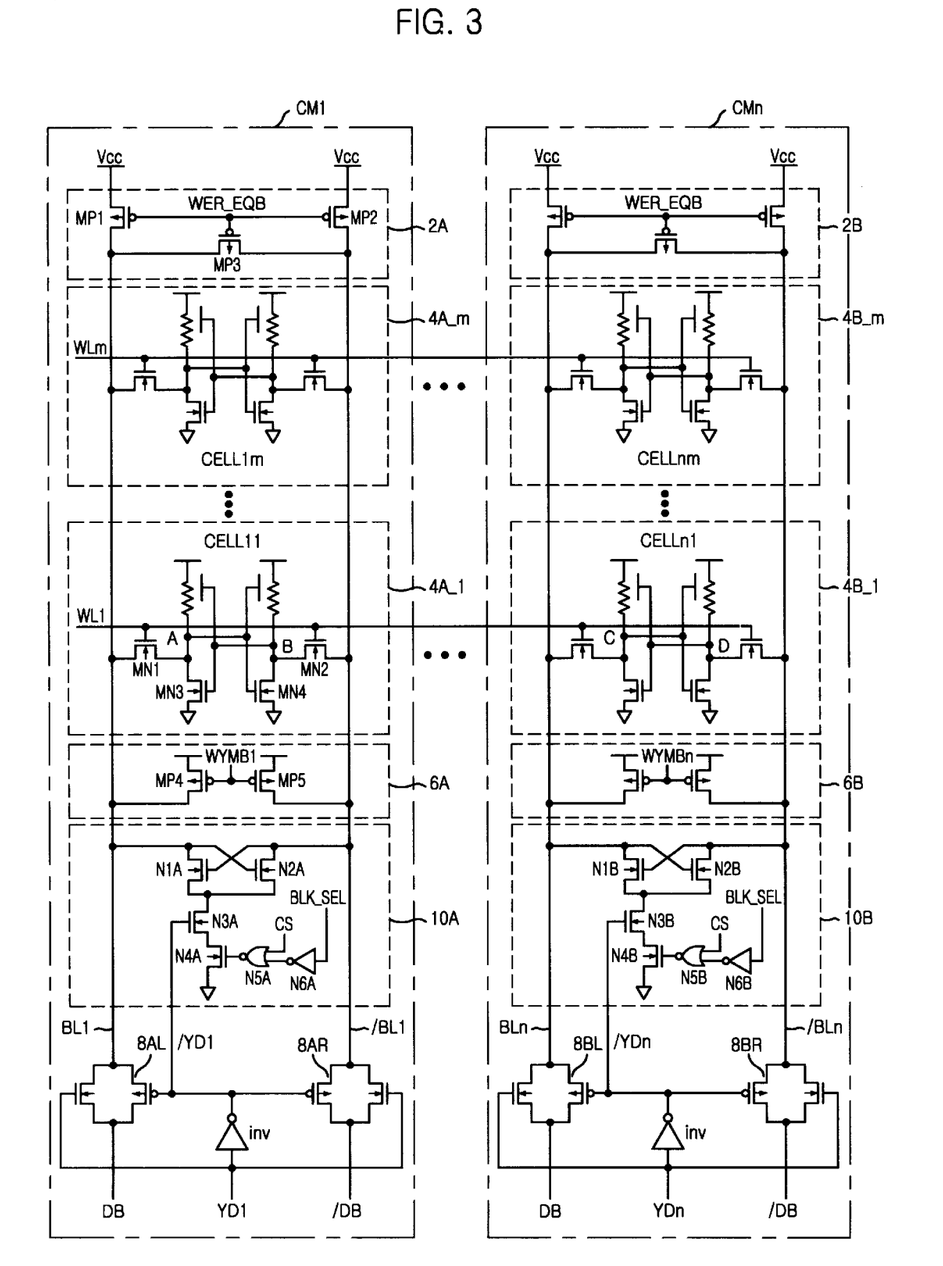
FIG. 3 is a circuit diagram of semiconductor memory device with re-writing circuit, in accordance with one preferred embodiment of the present invention.

FIG. 3 is a circuit diagram for illustrating a static random access memory device having re-writing circuit, in accordance with one preferred embodiment of the present invention.

Referring to FIG. 3, the SRAM comprises a plurality of columns CM1 to CMn. As an example, the column CM1 comprises a bit line BL1 and an inverted bit line /BL1, a plurality of unit memory cells 4A_1 to 4A_m, each of which is coupled between the bit line BL1 and the inverted bit line /BL1, an equalizing unit 2A for precharging & equalizing the bit line BL1 and the inverted bit line /BL1, a pull-up unit 6A for supplying current to the bit line BL1 and the inverted bit line /BL1 during read operation or precharging, and column gate elements 8AL and 8AR. The column gate element 8AL is coupled between the bit line BL1 and a data line DB, while the column gate element 8AR is coupled between the inverted bit line /BL1 and an inverted data line /DB, so as to electrically couple them in response to corresponding column decoding signal YD1. The column CM1 also comprises a re-writing circuit 10A coupled between the bit line BL1 and the inverted bit line /BL1, which rewrites the data of the unit memory cell related to the active word line and included in the column CM1 to the unit memory cell. More specifically, the re-writing circuit re-writes the data stored in the unit memory cell thereto, which is included in the selected block but unselected column, in response to a column decoding signal YD1, a block address signal BLK-SEL and a chip select signal CS.

Figure 4:
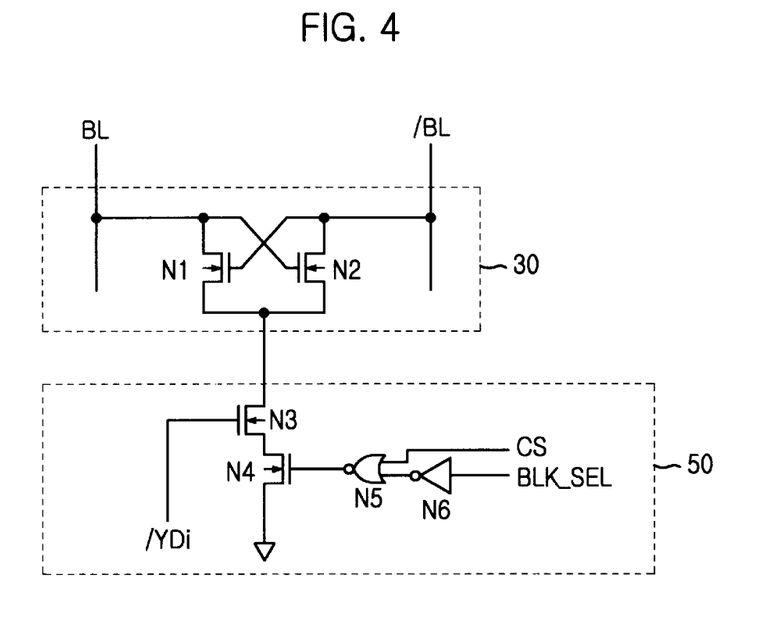
FIG. 4 is a detailed circuit diagram of the re-writing circuit shown in FIG. 3, according to one preferred embodiment of the present invention.

FIG. 4 is a detailed circuit diagram of the re-writing circuit according to one preferred embodiment of the present invention.

Referring to FIG. 4, the re-writing circuit includes a re-write part 30 and a current control part 50. The re-write part 30 is composed of two-cross-coupled MOS transistors N1 and N2. That is, the gate of NMOS transistor N1 and the drain of NMOS transistor N2 are commonly coupled to the inverted bit line /BL, and the gate of N2 and the drain of N1 are also commonly coupled to the bit line BL.

The re-write part 30 configured as above, pulls down one of the bit line BL and the inverted bit line /BL, and pulls up the other in condition that the one is relatively lower than the other.

The current control part 50 comprises two NMOS transistors N3 and N4 coupled in series between the common drain node of the NMOS transistors N1 and N2 and a ground. The gate of NMOS transistor N3 is applied with an inverted column decoding signal /YDI and the gate of the NMOS transistor N4 is controlled in response to the chip select signal CS and the block address signal BLK-SEL. In more detail, the current control part 50 further comprises an inverter N6 for inverting the block address signal BLK-SEL and a NOR gate N5 for NOR-operating both the output of the inverter N5 and the chip select signal CS so as to produce its result to the gate of the NMOS transistor N6. Thus, the NMOS transistor N4 is turned when the column is included in the selected block but the column itself is not selected in response to the block address signal BLK-SEL, the chip select signal CS and the column decoding signal YDi. Here, the chip select signal CS may not be used. In other words, the gate of NMOS transistor N4 can be simply applied with the block address signal BLK-SEL without the NOR gate N5 and the inverter N6. In addition, the signals applied to the gates of NMOS transistors N3 and N4 may be changed with each other.

Also, the NMOS transistors of the re-write part 30 may be substituted with PMOS transistors and other circuit elements as long as they are cross-coupled so as to compare the voltage levels of the bit line BL and the inverted bit line /BL for pulling up one, based on the comparing result.

In the current control part 50, NMOS transistors can be substituted by PMOS transistors and other current path control circuit element (e.g. transfer gate).

Referring back to FIG. 3, the equalizing unit 2A, the unit memory cells and the pull-up unit 6A are in detail depicted as an example, and they can be configured otherwise, as conventional technologies.

Here, referring to FIGS. 3 and 4, the operation of the static random access memory, according to one preferred embodiment of the present invention, will be explained.

Referring to FIG. 3, in column CM1, three PMOS transistors MP1, MP2 and MP3 of the equalizing unit 2A is gated with WER-EQB signal, which is "high" level during read/write cycle. Thus, PMOS transistors MP1, MP2 and MP3 of the equalizing unit 2A are turned off during read/write operation so as to be disabled. Otherwise, WER_EQB signal is "low" level so that PMOS transistors MP1, MP2 and MP3 are turned on, thereby precharging and equalizing the bit line BL and the inverted bit line /BL to the power voltage Vcc.

In the pull-up unit 6A, the WYMB signal applied to the gate of PMOS transistors MP4 and MP5 is in "high" level during write operation and is in "low" level otherwise. Thus, PMOS transistors MP4 and MP5 can be turned on except that write operation is made. Also, the column gate elements 8AL and 8AR are controlled by the column decoding signal YD1.

On the other hand, referring to FIG. 4, two NMOS transistors N1 and N2, which constitute the re-write part 30, amplify the voltage difference between the bit line BL and the inverted bit line /BL so as to re-write, as described above. In addition, the inverted column decoding signal /YDI (here, "I" represents 1 to n) is applied to the gate of NMOS transistor N3 which is turned off such that the re-write operation cannot be performed in the selected column, based on the column decoding. In other words, NMOS transistor N3 is basically controlled by column address. When the column is selected, the corresponding column decoding signal YDI is "low" level, and otherwise, it is "high" level.

As a result, only the re-write circuit included in the unselected column may be operated. Also, since the column decoding signal YDI is generated from the column address and it is also required for cell read/write operation, the re-write circuit of the present invention would not require any additive circuitry for generating separate control signal for NMOS transistor N3 of the re-write circuit.

As described above, a read cycle is performed for the memory cell included in the unselected column, which reduce the cell stability in turn. Accordingly, the re-write circuit of the unselected column senses and amplifies the minute voltage difference between the bit line BL and the inverted bit line /BL of the unselected column, so that the voltage levels of the cell nodes in the memory cell can be maintained as original states. Here the cell nodes of memory cell are electrically coupled between the bit line BL and inverted bit line /BL by word line activation.

For example, it is assumed that the word line WL1 of FIG. 3 is active to "high" level and the column CM1 is selected by the column address. If the word line WL1 is "high" level, the access transistors of unit memory cells CELL11, . . . CELLn1 are turned on so that the cell nodes are electrically coupled to corresponding bit line and inverted bit line, respectively. For example, the storage nodes A and B of CELL11 in column CM1 are coupled to the bit line BL1 and the inverted bit line /BL1, while the storage nodes C and D of CELLn1 in column CMn are coupled to the bit line BLn and the inverted bit line /BLn. Here, if the memory cell CELLn1 in the unselected column CMn stores a "high" level data, the voltage level of the bit line BLn becomes higher than the voltage level of the inverted bit line /Bln. Thus, the NMOS transistor N2B of the re-write circuit 10B in column CMn is firstly turned on so as to pull down the inverted bit line /BLn which in turn becomes "low" level. Then, due to the "low" level of /BLn, the NMOS transistor N1B of the re-write circuit 10B is continuously turned off so that the bit line BLn maintains "high" level. Thus, the memory cell CELLn1 (4B_1) is re-written with the original data. As this, since the nodes C and D of the memory cell 4B_1 can maintain original voltage level to some degree, the cell stability is increased.

In FIG. 4, the NOR gate N5 and the inverter N6 produces the control signal for controlling the gate of the NMOS control transistor N4, based on the block address signal BLK-SEL and the chip select signal CS, as described above. Here, the chip select signal CS is active ("high" in this embodiment) only when the chip is selected, and the block address signal BLK-SEL is active ("high" in this embodiment) only when the block including the memory cell being accessed is selected. Therefore, the output of the NOR gate 5 is active to "high" level only when both the block and the chip are selected, so that the re-write part 30 is activated. This scheme reduces the power consumption at stand-by columns.

Figure 2A:
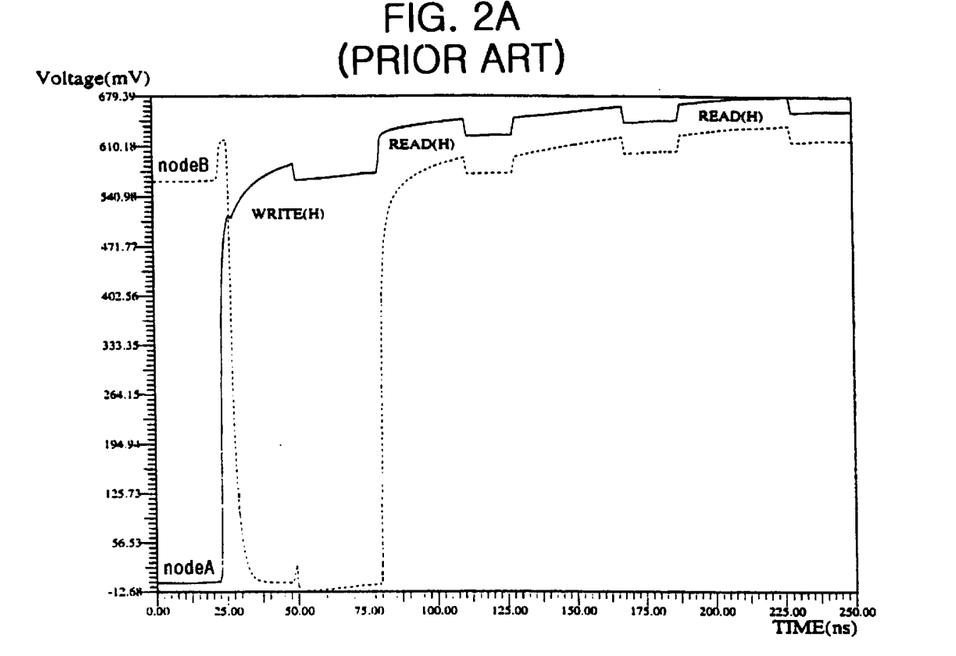
FIGS. 2A and 2B show the waveforms which illustrate the voltage characteristics of cell node shown in FIG. 1.
Figure 2B:
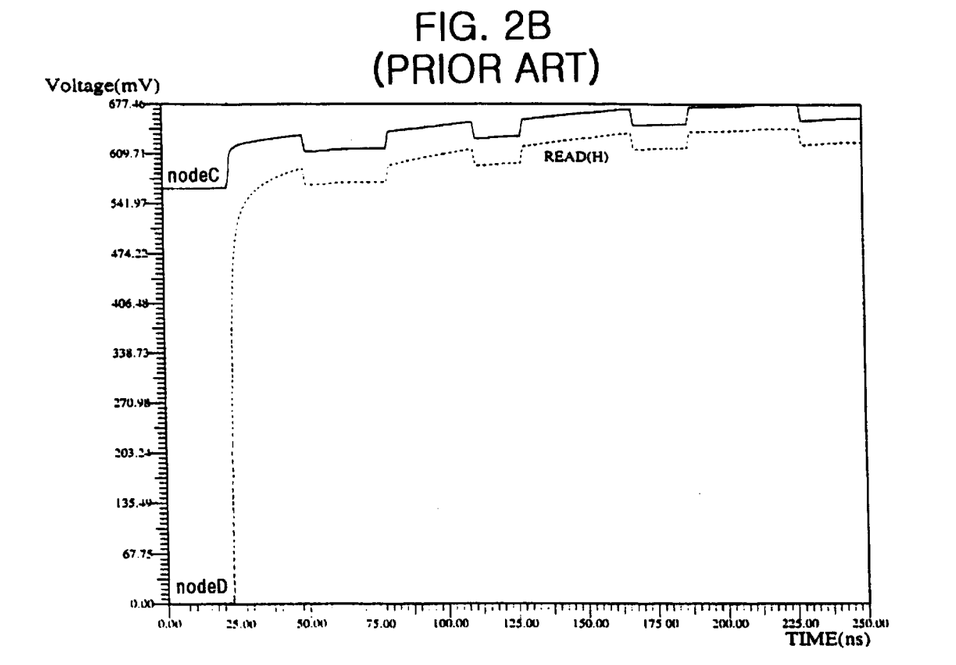
Figure 6A:
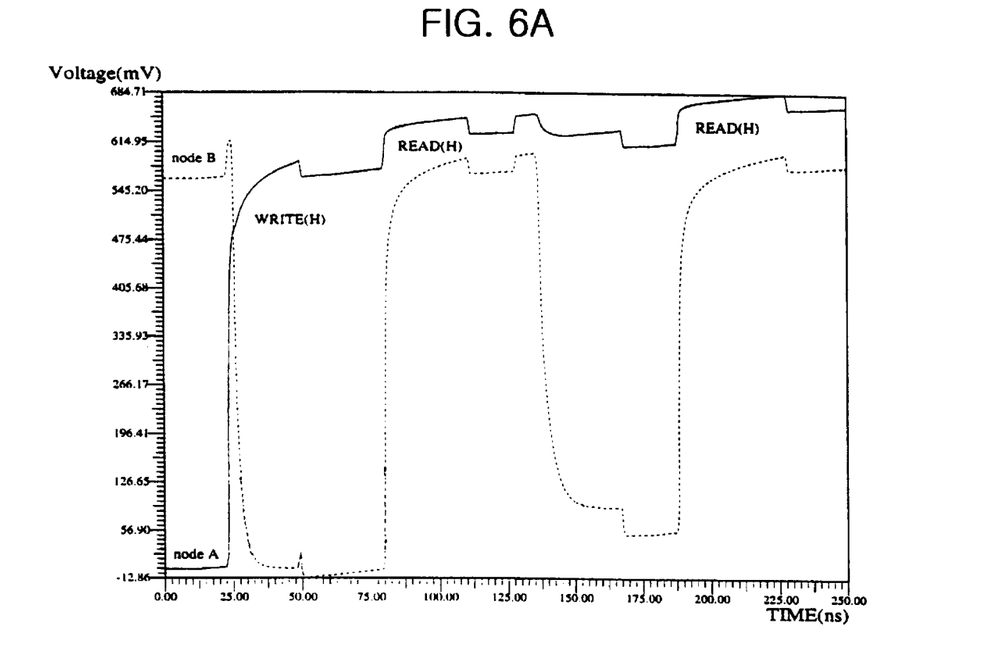
FIGS. 6A and 6B are waveforms for illustrating the voltage characteristics of the cell node shown in FIG. 3.
Figure 6B:
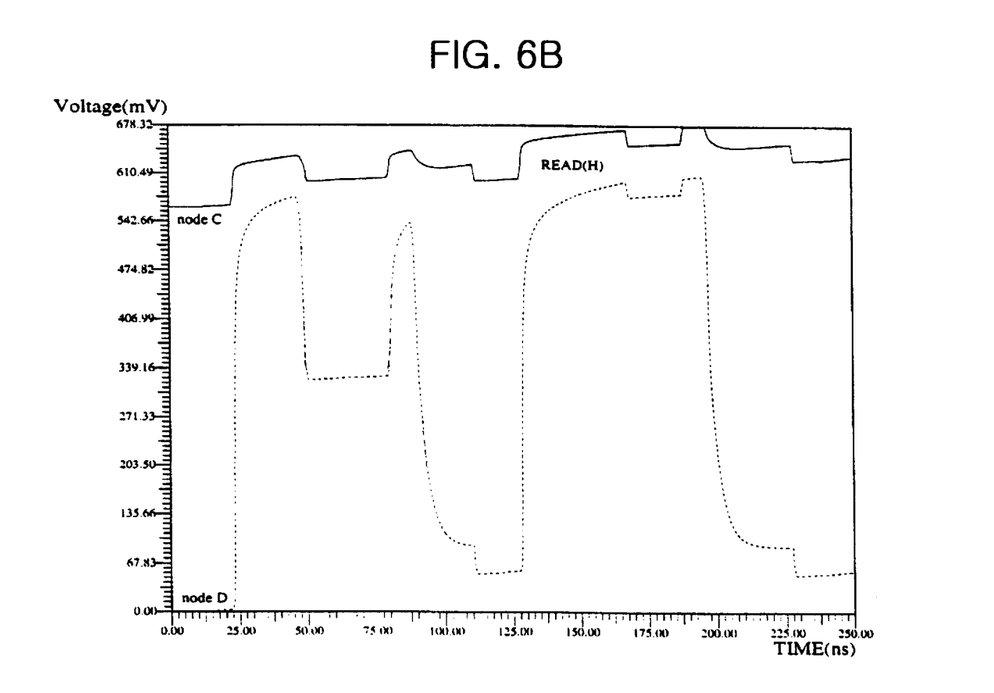

Meantime, the present inventor has performed a simulation for testing the effect of the present invention and the simulation results are described in FIGS. 2A, 2B, 6A and 6B and the following table 1. In more detail, FIGS. 2A and 2B illustrates the voltage level variations of the memory cell node (or storage node) during read/write operations in the semiconductor memory device shown in FIG. 1, while FIGS. 6A and 6B illustrate the voltage level variations of the memory cell node (or storage node) during read/write operations in the semiconductor memory device shown in FIG. 3 according to one preferred embodiment of the present invention. In addition, the following table 1 shows the cell node voltages of FIGS. 1 and 3 during read/write operations in numerals, for comparison.

TABLE 1

|  | CELL11 WRITE | CELL11 READ | CELLn1 READ | CELL11 READ |
|---|---|---|---|---|
| SRAM of FIG. 1 (GENERAL) | | | | |
| node A | 555.38 mV | 640.39 mV | 656.15 mV | 675.43 mV |
| node B | 0.67 mV | 571.84 mV | 611.90 mV | 635.02 mV |
| voltage difference | 557.71 mV | 68.55 mV | 44.25 mV | 40.41 mV |
| node C | 626.71 mV | 646.20 mV | 663.81 mV | 674.94 mV |
| node D | 568.65 mV | 604.22 mV | 628.36 mV | 641.31 mV |
| voltage difference | 58.06 mV | 41.98 mV | 35.45 mV | 33.63 mV |
| SRAM of FIG. 3 (THIS INVENTION) | | | | |
| node A | 575.02 mV | 640.66 mV | 627.14 mV | 676.72 mV |
| node B | 1.6 mV | 571.68 mV | 91.34 mV | 581.98 mV |
| voltage difference | 573.42 mV | 68.98 mV | 535.80 mV | 94.74 mV |
| node C | 627.88 mV | 619.47 mV | 664.78 mV | 647.80 mV |
| node D | 558.85 mV | 120.38 mV | 576.50 mV | 95.71 mV |
| voltage difference | 69.03 mV | 499.09 mV | 88.28 mV | 552.09 mV |

Figure 5:
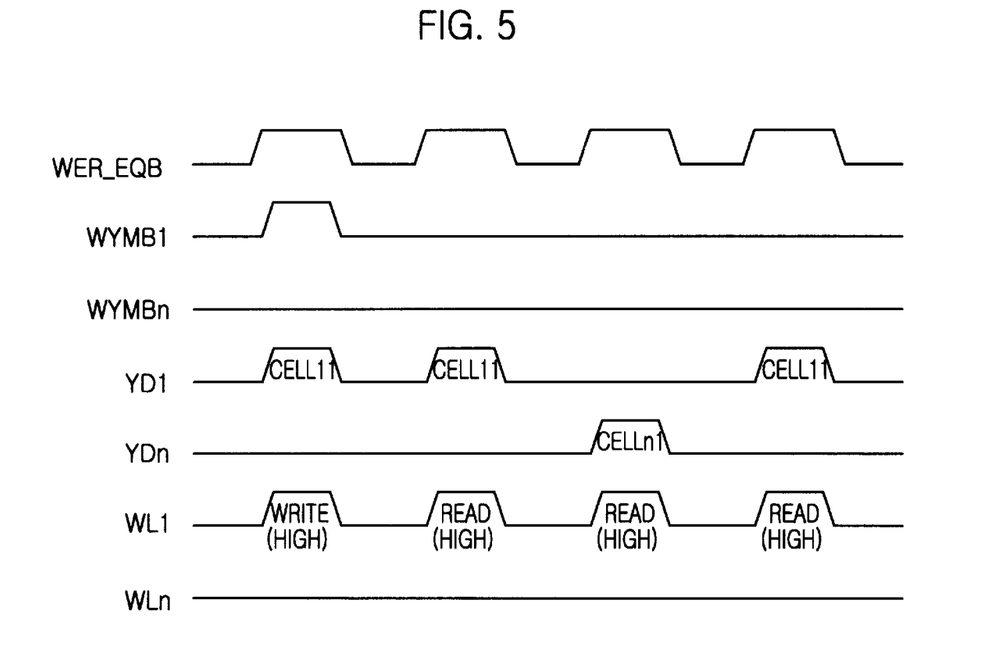
FIG. 5 is a timing diagram for illustrating a simulative operation for testing the variation of cell nodes in the semiconductor memory device shown in FIG. 3 according to the present invention, compared with that of the semiconductor memory device shown in FIG. 1.

FIG. 5 illustrates the simulation sequence performed by the inventor for testing the effect of the invention. The simulation has been performed in the following sequence.

Referring to FIG. 5, the memory cell CELL11 having "low" level data and the memory cell CELLn1 having "high" level data, at the initial stage. First cycle, the word line WL1 and the column decoding signal YD1 became active to "high" level, so that a "high" level data was written to the memory cell CELL11. Then, the read operation for the memory cell CELL11 and the read operation for the memory cell CELLn1 are sequentially performed. Here, the read operation of the memory cell CELLn1 was made by activating the word line WL1 and the column decoding signal YDn to "high" level. Then, the read operation for the memory cell CELL11 was performed again. In FIG. 5, 'WER_EQB' represents the signal applied to the equalizing units 2A and 2B, the signal 'WYMB1' applied to the pull-up unit 6A in the column CM1 and the signal 'WYMBn' applied to the pull-up unit 6B in the column CMn.

As mentioned above, the simulation was performed for testing the cell stability by performing read/write cycle for one memory cell and then performing read cycle for another memory cell so as to compare the voltage level acquired in the latter read cycle.

The simulation results of the general SRAM shown in FIG. 1, are shown in FIGS. 2A and 2B, in which FIG. 2A illustrates the voltage level variation with regard to times at the memory cell CELL11, while FIG. 2A illustrates the voltage level variation at the memory cell CELLn1. Further, the solid line of FIG. 2A represents the voltage level of cell node A and the broken line of FIG. 2A represents the voltage level of cell node B. Likewise, in FIG. 2B, the solid line represents the voltage level of cell node C and the broken line represents the voltage level of cell node D.

As known from FIGS. 2A and 2B, the voltage difference between nodes of memory cell grows less as read/write operation for the memory cells related to the same word line. Specifically, as shown in the table 1, the voltage difference of nodes in the memory cell CELL11 is reduced from 557.71 [mV] to 40.41 [mV] and the voltage difference of nodes in the memory cell CELLn1 is reduced from 58.06 [mV] to 33.63 [mV].

Next, referring to FIGS. 6A and 6B, the cell node voltage variation will be considered in the semiconductor memory device according to one preferred embodiment of this invention. FIG. 6A shows the voltage variation in the memory cell CELL11, in which the solid line represents the voltage level of the cell node A and the broken line represents the voltage level of the cell node B. Likewise, FIG. 6B shows the voltage variation in the memory cell CELLn1, in which the solid line represents the voltage level of the cell node C and the broken line represents the voltage level of the cell node D.

In FIGS. 6A and 6B, the voltage difference of cell nodes was not reduced but recovered to a preferred level by means of the re-write circuit. Also, as illustrated in the table 1, the voltage difference of the memory cell CELL11 was changed as 573.42 mV→68.98 mV→535.80 mV→94.7 mV, and the voltage difference of the memory cell CELLn1 was changed as 69.03 mV→499.09 mV→88.28 mV→552.09 mV. In summary, the cell stability of SRAM shown in FIG. 3 is tremendously increased, compared with that of SRAM shown in FIG. 1. This improvement can be made by re-writing the original data to the memory cell included in unselected column, thereby making the voltage level of the cell nodes stable.

Thus, the semiconductor memory device of this invention has the cell stability large even under low power voltage below 2.0 Volts and low temperature below −40° C.

As described above, the present invention improves the cell stability of semiconductor memory device, e.g. SRAM, especially which is operated in the low power voltage and/or at the low temperature. Thus, there is an effect that SRAM may not require any separate word line bootstrap circuit. Also, in this invention, since the column decoding signal is used to control the current path, the auto re-writing can be made whenever the corresponding block is selected without any separate timing control.

Although preferred embodiments of the present invention has been illustrated and described, various alternatives, modifications and equivalents may be used. Therefore, the foregoing description should not be taken as limiting the scope of the present invention which is defined by the appended claims.

What is claimed is:

1. A semiconductor memory device comprising:
   a bit line and an inverted bit line;
   a memory cell coupled between the bit line and the inverted bit line for storing data; and a re-writing circuit coupled between the bit line and the inverted bit line for re-writing the data stored in the memory cell to the memory cell, in response to, at least, one read/write control signal for controlling read/write operation of the memory cell, wherein said re-writing circuit comprises:

a first MOS transistor, the source-drain path of which is coupled between said bit line and a ground and the gate of which is coupled to said inverted bit line;

a second MOS transistor, the source-drain path of which is coupled between said inverted bit line and said ground and the gate of which is coupled to said bit line; and first and second control transistors, the source-drain paths of which are coupled in series between the sources of the first and the second MOS transistors and a ground, and the gates of which are coupled to corresponding read/write control signals, respectively, wherein said first control transistor is gated in response to corresponding column decoding signal, and said second control transistor is gated in response to the combination of a chip select signal and a block select signal.

2. The semiconductor memory device in accordance with the claim 1, wherein said device is a static random access memory device.

3. The semiconductor memory device in accordance with the claim 2, wherein said device is provided with a low power voltage equal to or below 2.0 volts.

4. The semiconductor memory device in accordance with the claim 3, wherein said re-writing circuit further comprises:

an inverter for inverting said block select signal;

a NOR gate for receiving the output of the inverter and the chip select signal so as to produce its output to the gate of said second control transistor.

5. A semiconductor memory device comprising:

a bit line and an inverted bit line;

a memory cell coupled between the bit line and the inverted bit line for storing data;

a word line for accessing the memory cell;

an equalizing unit for precharging and equalizing the bit line and the inverted bit line; and a re-writing circuit coupled between the bit line and the inverted bit line for performing re-writing the data of the memory cell included in selected block but related to unselected column, wherein said re-writing circuit comprises:

a pair of re-writing transistors, each of which has a drain and a gate cross-coupled between said bit line and said inverted bit line, for pulling down the one having relative low voltage level between the bit line and the inverted bit line;

a first control transistor for controlling the activation of said re-writing transistors in response to a column decoding signal; and a second control transistor for controlling the activation of the re-writing circuit when the column of the memory cell is not selected, in response to a combination of a chip select signal and a block select signal.

6. The semiconductor memory device in accordance with the claim 5, wherein said device is a static random access memory device.

7. The semiconductor memory device in accordance with the claim 6, wherein said device is provided with a low power voltage equal to or below 2.0 volts.

* * * * *